(12) United States Patent
Kim et al.

(10) Patent No.: US 7,418,368 B2
(45) Date of Patent: Aug. 26, 2008

(54) METHOD AND SYSTEM FOR TESTING PROCESSOR CORES

(75) Inventors: Dae Ik Kim, Fishkill, NY (US); Jonghae Kim, Fishkill, NY (US); Moon J Kim, Wappingers Fall, NY (US); James R Moulic, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/624,329

(22) Filed: Jan. 18, 2007

(65) Prior Publication Data

US 2008/0177506 A1 Jul. 24, 2008

(51) Int. Cl.
*G06F 15/00* (2006.01)

(52) U.S. Cl. ..................... 702/185
(58) Field of Classification Search ............... 702/185
See application file for complete search history.

(56) References Cited

U.S. PATENT DOCUMENTS

| | | | |
|---|---|---|---|
| 6,922,783 B2 | 7/2005 | Knee et al. | |
| 7,028,196 B2 | 4/2006 | Soltis, Jr. et al. | |
| 7,080,267 B2 | 7/2006 | Gary et al. | |
| 2005/0034002 A1* | 2/2005 | Flautner | 713/322 |
| 2005/0289365 A1 | 12/2005 | Bhandarkar | |

OTHER PUBLICATIONS http://mw1.merriam-webster.com/dictionary/progressively, p. 1.*

* cited by examiner

*Primary Examiner*—Tung S Lau
(74) *Attorney, Agent, or Firm*—Patrick J. Daugherty; Driggs, Hogg, Daugherty & Del Zoppo Co., LPA

(57) ABSTRACT

Systems, methods and program codes are provided for testing multi-core processor chip structures. Individual processor core power supply voltages are provided through controlling individual power supplies for each core, in one aspect to ensure that one or more cores operate at clock rates in compliance with one or more performance specifications. In one example, a first power supply voltage supplied to a first processing core differs from a second core power supply voltage supplied to a second processing core, both cores operating in compliance with a reference clock rate specification. Core power supply voltages may be selected from ordered discrete supply voltages derived by progressively raising or lowering a first supply voltage, optionally wherein the selected supply voltage also enables the core to operate within another performance specification.

21 Claims, 4 Drawing Sheets

METHOD AND SYSTEM FOR TESTING PROCESSOR CORES

FIELD OF THE INVENTION

The present invention relates to devices, and methods and program products for evaluating the performance of semiconductor processor components, and more particularly for testing multiple-core processor structures.

BACKGROUND OF THE INVENTION

Multi-core microprocessor (MCP) chips comprise a plurality of independent digital signal processor (DSP) cores on one single integrated circuit (IC) chip package, and are useful and efficient structures for central processing unit (CPU) and System-on-a-chip or System on Chip (SoC or SOC) applications. The provision of pluralities of individual instruction processing cores enables higher computation capacity relative to single processor chip structures. Computer systems incorporating MCP's usually consume less power and have a lower cost and higher reliability than alternative multi-chip systems, as well as provide assembly cost advantages by requiring fewer physical system components.

MCP's must be tested in order to assure that a given MCP meets expected or required performance specifications. Problems arise when individual cores on an MCP have different performance characteristics in response to similar input and operating environments, for example due to with-in chip process variations. More particularly, one or more cores may fail an individual core performance requirement that the remainder pass, and failure of only one core will cause an entire MCP structure to fail prior art MCP configuration and/or testing methodologies even if most or all of the rest perform within specifications.

Thus there is a need for improved testing methods and systems for evaluating and increasing manufacturing yields from MCP chip designs and implementations that account for within-chip processor process and performance variations.

SUMMARY OF THE INVENTION

According to the present invention, a method is provided comprising for testing a multi-core processor system chip. A first power supply voltage supplied to a first processor core is selected in response to a performance specification. A second power supply voltage supplied to a second processor core is selected in response to the second core not meeting the performance specification at the first power supply voltage, the second power supply voltage different from the first power supply voltage, the second processor core meeting the performance specification when operating in response to the second power supply voltage. And the chip is configured to operate by providing the first core with the first power supply voltage and the second processing core with the second power supply voltage.

In another aspect, a method selects a second power supply voltage by comparing an initial second core clock rate generated by the second core in response to the first power supply voltage to a reference clock rate specification, and raises or lowers the first power supply voltage to determine the second core power supply voltage. In one aspect an overall chip power consumption is determined in response to providing the first core with the first power supply voltage, the second core with the second core power supply voltage, and passing or not passing the chip in response to a comparison with a chip power consumption specification.

In another method, the second power supply voltage is determined by progressively lowering the first supply voltage to define a plurality of progressively ordered discrete supply voltages, and selecting a lowest supply voltage of the plurality of ordered discrete supply voltages at which the second core operates at a rate in compliance with the reference clock rate specification. In one aspect, the reference clock rate specification is a sum of a specified minimum reference clock rate and a margin rate. In another aspect determining the second core supply voltage comprises adding a margin voltage to the selected lowest supply voltage. In another method determining the second core supply voltage comprises selecting the lowest supply voltage of the plurality of ordered discrete supply voltages that is also greater than a specified functional threshold voltage.

In one method, determining a second core supply voltage comprises selecting a lowest supply voltage of a plurality of ordered discrete supply voltages that also enables the second core to operate within a performance specification when processing a functional test code. In one aspect the functional test code is a core bottleneck behavior code or a worst-case delay code. And still further, in one method a third core power supply voltage is selected and supplied to a third processing core by raising the first power supply voltage until the third core meets the reference clock rate specification, the chip configured to provide the third core with the third power supply voltage.

In another aspect, a system for testing a multi-core processor chip is provided comprising a testing means connected to a first and second adjustable processor core power supplies. The testing means is configured to cause the first power supply to supply a nominal power supply voltage to a first multi-core chip processor core and the second power supply to supply a second power supply voltage to a second multi-core chip processor core in response to the second core not meeting a performance specification at the first power supply voltage, wherein the second power supply voltage is more or less than the nominal power supply voltage and the second processor core meets the performance specification when operating in response to the second power supply voltage. In one aspect the at least one inter-core voltage-level translation communication block is provided in communication with the cores and configured to the cores to function with divergent on-signal supply voltages. Still further the testing means may select the second power supply voltage by selecting a lowest supply voltage of a plurality of ordered discrete supply voltages that are also each greater than a specified functional threshold voltage. In another aspect the testing means cause a third adjustable power supply to supply a third power supply voltage to a third multi-core chip processor core, the third power supply voltage more than the nominal voltage, the third power supply voltage is selected by the testing means to cause the third core to meet the reference clock rate specification.

In another aspect, a system testing means determines a second core supply voltage by selecting a lowest supply voltage of a plurality of ordered discrete supply voltages that also enables the second core to operate within a performance specification when processing a functional test code. In one aspect, the functional test code is a core bottleneck behavior code or a worst-case delay code.

In another aspect, a method is provided for producing computer executable program code and providing the program code to be deployed to and executed on a computer system, for example by a service provider who offers to implement, deploy, and/or perform functions for others. Still further, an article of manufacture comprising a computer usable medium having the computer readable program embodied in said medium may be provided. The program code comprises instructions which, when executed on the computer system, cause the computer system to test and optionally selectively adjust multi-core processor chip structure individual processor core power supply voltages to ensure that one or more cores operate at clock rates in compliance with one or more performance specifications.

In one aspect, a program code causes a computer system to test a multi-core processor system chip by selecting a first power supply voltage supplied to a first processor core in response to a performance specification, and selecting a second power supply voltage supplied to a second processor core in response to the second core not meeting the performance specification at the first power supply voltage, the second power supply voltage different from the first power supply voltage, the second processor core meeting the performance specification when operating in response to the second power supply voltage. The code further causes the computer to configure the chip to operate by providing the first core with the first power supply voltage and the second processing core with the second power supply voltage.

In another aspect, a program code, when executed on a computer system, causes the computer system to select the second power supply voltage by comparing an initial second core clock rate generated by the second core in response to the first power supply voltage to a reference clock rate specification, and raise or lower the first power supply voltage to determine the second core power supply voltage in response to the initial second core clock rate not complying with the reference clock rate specification.

In one aspect, the program code causes a computer system to determine an overall chip power consumption in response to providing the first core with the first power supply voltage and the second core with the second core power supply voltage, and pass or not pass the chip in response to a comparison of the overall chip power consumption to a chip power consumption specification.

Still further, in another aspect a program code causes a computer system to determine a second core power supply voltage by progressively lowering a first supply voltage to define a plurality of progressively ordered discrete supply voltages, and selecting a lowest supply voltage of a plurality of ordered discrete supply voltages at which the second core operates at a rate in compliance with the reference clock rate specification. In one aspect the program code causes the computer system to determine the second core supply voltage by adding a margin voltage to a selected lowest supply voltage.

BRIEF DESCRIPTION OF THE DRAWINGS

These and other features of this invention will be more readily understood from the following detailed description of the various aspects of the invention taken in conjunction with the accompanying drawings in which.

Figure 1:
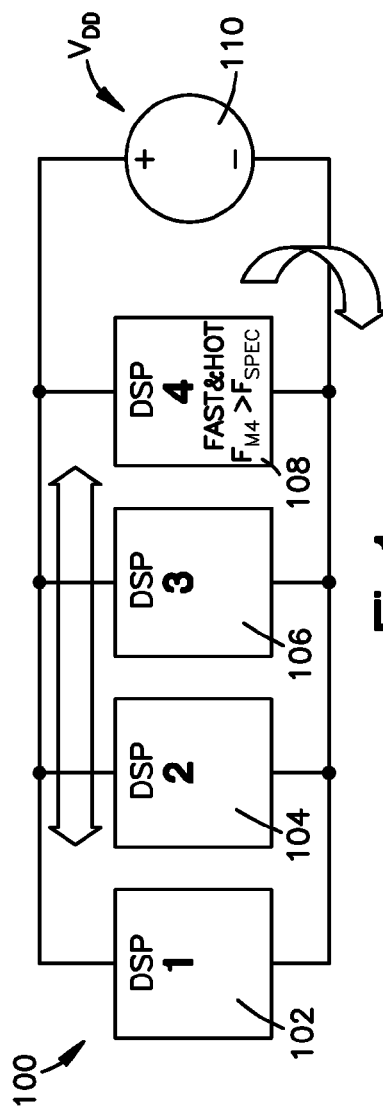
FIG. 1 is a schematic representation of a prior art multi-core processor structure.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

For convenience purposes, the Detailed Description of the Invention has the following sections:

I. General Description

II. Computerized Implementation

I. General Description

FIG. 1 provides a schematic representation of a conventional prior art multi-core processor structure (MCP) 100 with four individual processing cores 102,104,106,108 each receiving a power supply voltage $V_{DD}$ from a power supply 110. Success or failure of the MCP 100 to meet performance standards is generally determined under prior art methods by observing both individual core and chip-wide behavior. Of first concern is the operational processing speed of each individual core 102,104,106,108, which may each be described by as a core clock rate ($f_{CLK, k}$), where k is an integer denoting one of the cores 102,104,106,108: each core k must demonstrate a minimum reference clock speed $f_{spec}$ for a specified nominal power supply voltage $V_{DDnom}$: if any one of the cores 102,104,106,108 fails to meet this requirement the entire MCP structure fails under prior art testing methodologies and systems, and no means are provided for correcting such a deficiency.

A second concern is the overall power consumption of the MCP chip 100. MCP's are generally required to perform within maximum power consumption requirements, and thus the MCP 100 power consumption $W_{CHIP}$, the sum of the power consumptions $P_k$ of each of the individual processor cores 102,104,106,108, must stay below a specified maximum $W_{Max}$ to meet performance specifications under prior art testing methodologies and systems, else the entire chip 100 fails. The power consumption $P_k$ of each of the individual processor cores 102,104,106,108 may be described by Equation 1:

$$P_k = (\alpha)(V_{DD}^2)(f_{CLK, k}); \qquad \text{Equation 1}$$

where $P_k$ is the power in Watts for a core k 102,104,106 or 108, $V_{DD}$ is the supply voltage in Volts from the power supply 110, $f_{CLK, k}$ is a processor core's clock frequency in Hertz, and α is a semiconductor random variation parameter, for example a parasitic capacitance and resistance factor.

Although faster is generally better in terms of processor computing performance, as shown by Equation 1 a higher individual clock rate $f_{cLK, k}$ for a supply voltage $V_{DD}$ will result in a correspondingly higher core power consumption $P_k$. To ensure that total MCP 100 power consumption remains below a specified maximum power consumption ($W_{CHIP} < W_{MAX}$) prior art chip testing methods require that each clock rate $f_{cLK, k}$, resulting from the common power supply voltage $V_{DD}$ be less than a specified maximum clock rate $f_{max}$, else the higher power consumption $P_k$ of that core indicates that total chip power consumption will be greater than a specified maximum ($W_{CHIP} > W_{MAX}$), and the entire chip MCP 100 structure fails, even though all of the remaining cores may have clock rates within specifications (for example, for the remaining core's k, $f_{CLK,k} < f_{max}$).

As the number of individual cores increases in MCP structures, the likelihood of within-chip core performance variation increases, and thus the likelihood that one individual core 102,104,106,108 will fail to meet prior art specifications increases: therefore, MCP manufacturing yields under prior art testing methodology decrease as more individual cores are incorporated into single MCP chip structures.

Figure 2:
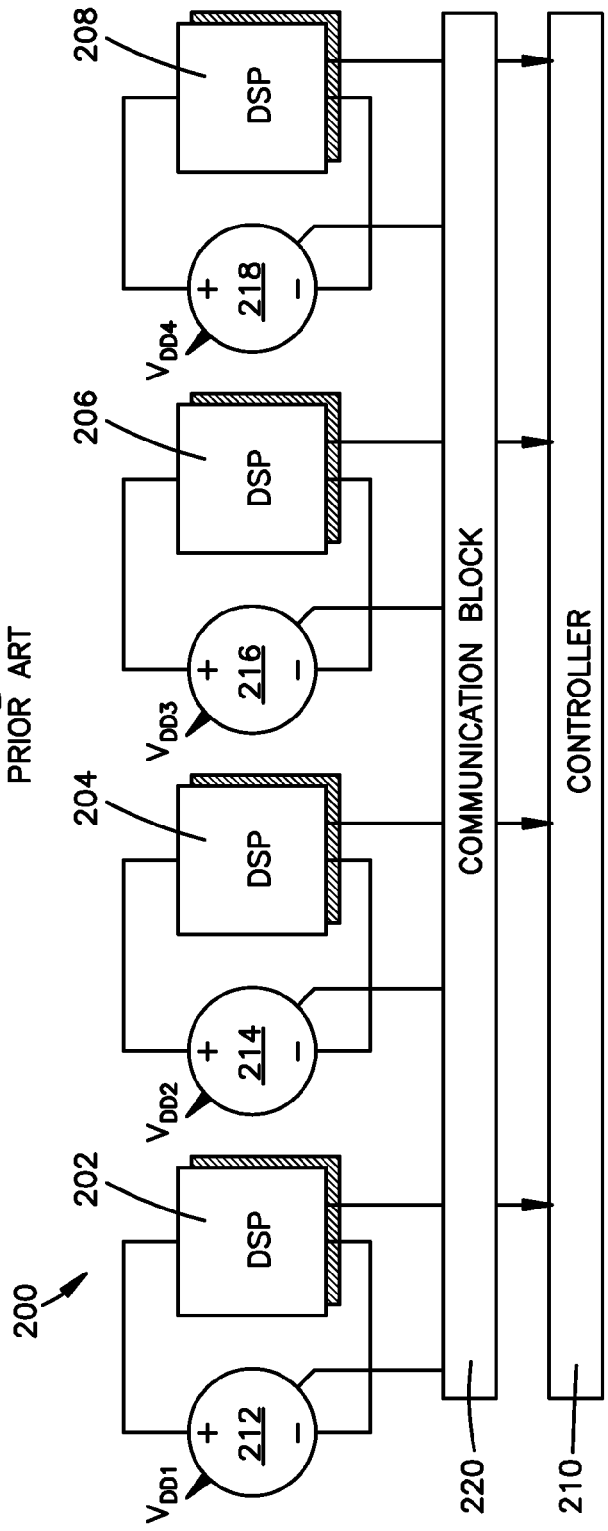
FIG. 2 is a schematic representation of a multi-core processor structure according to the present invention.

Turning now to FIG. 2, a multi-core MCP structure 200 appropriate for practicing the present invention is provided, comprising a plurality of individual processing cores 202, 204,206,208, each connected to an adjustable power supply 212,214,216,218, respectively, each of the power supplies 212,214,216,218 controlled by a controller 210. It is known that each of the individual processing cores 202,204,206,208 may evidence divergent clock rates $f_{CLK, k}$ in response to similar operational inputs and operating environments. For example, in response to the same nominal power supply voltage $V_{DDnom}$ the first core 102 may exhibit an impermissibly slow clock rate relative to a minimum reference clock speed ($f_{CLK, k} < f_{spec}$), the second core 104 may exhibit an impermissibly fast clock rate relative to a maximum clock speed ($f_{CLK, k} > f_{max}$), and the other remaining cores 106,108 may operate within specifications ($f_{CLK, k} > f_{spec}$ and $< f_{max}$). What is important is that the present invention provides a means to adjust each individual core clock rate $f_{CLK, k}$ during testing process steps by adjusting individual core power supply voltages $V_{DD, k}$ as required, thereby enabling the MCP chip 200 to pass specifications, wherein the chip 200 would otherwise fail prior art testing methods, and thus testing the chip 200 according to the present invention can increase manufacturing yields.

The individual power supplies 212,214,216,218 may be located off-chip, although on-chip embodiments may also be practiced. It is also to be understood that the number of cores 212,214,216,218 is chosen for illustrative purposes only, and that the testing methods and systems according to the present invention may assess MCP's 200 having more or less cores 212,214,216,218 than the embodiments described herein.

An advantage of the present invention is that in testing the MCP 200 a testing process may use the controller to individually select and adjust a supply voltage $V_{DD, k}$ supplied to each core 202,204,206,208 by its respective adjustable power supply 212,214,216,218, and thereby select a clock rate $f_{CLK, k}$ for each as required to meet one or more specifications applied during chip testing routines. For example, if a core 202 clock rate $f_{CLK,k}$ fails to meet a minimum reference clock speed $f_{spec}$ during testing then the controller may increase the supply voltage $V_{DD, k}$ supplied by its adjustable power supply 212 to thereby raise its clock rate $f_{CLK,k}$ equal to or greater than $f_{spec}$ and thereby bring the core 202 into specification. This may be performed on each of the remaining cores 204, 206,208 as needed, and thus each core 202,204,206,208 may be configured to pass a clock speed specification ($f_{spec}$), enabling an otherwise failing MCP 200 to pass said specification.

The MCP 200 further comprises at least one inter-core voltage-level translation communication block 220 configured to enable the cores 202,204,206,208 to function with divergent on-signal supply voltages $V_{DD, k}$. The communication block 220 may be located between the controller 210 and the cores 202,204,206,208. Alternatively one or more communication blocks 220 may located among cores 202,204, 206,208 themselves, for example in the case of intra-core networks. Still further, the controller 210 may itself be configured to provide inter-core voltage-level translation functions and separate block structures 220 may be omitted.

Furthermore, as lowering a core clock rate lowers the power consumption $P_k$ for that core, in response to test process routines the controller 210 may thus lower overall chip power consumption $W_{CHIP}$ of the MCP 200 and enable an otherwise failing MCP 200 to pass power consumption specifications. For example, if the core 202 clock rate $f_{CLK, k}$ exceeds a maximum clock rate $f_{max}$ during a test routine then the controller 210 may be instructed to decrease the supply voltage $V_{DD, k}$ supplied by adjustable power supply 212 to thereby lower said clock rate $f_{CLK, k}$ and bring core 202 within the test routine specifications (for example, $f_{CLK, k}$ less than or equal to $f_{max}$).

Figure 3:
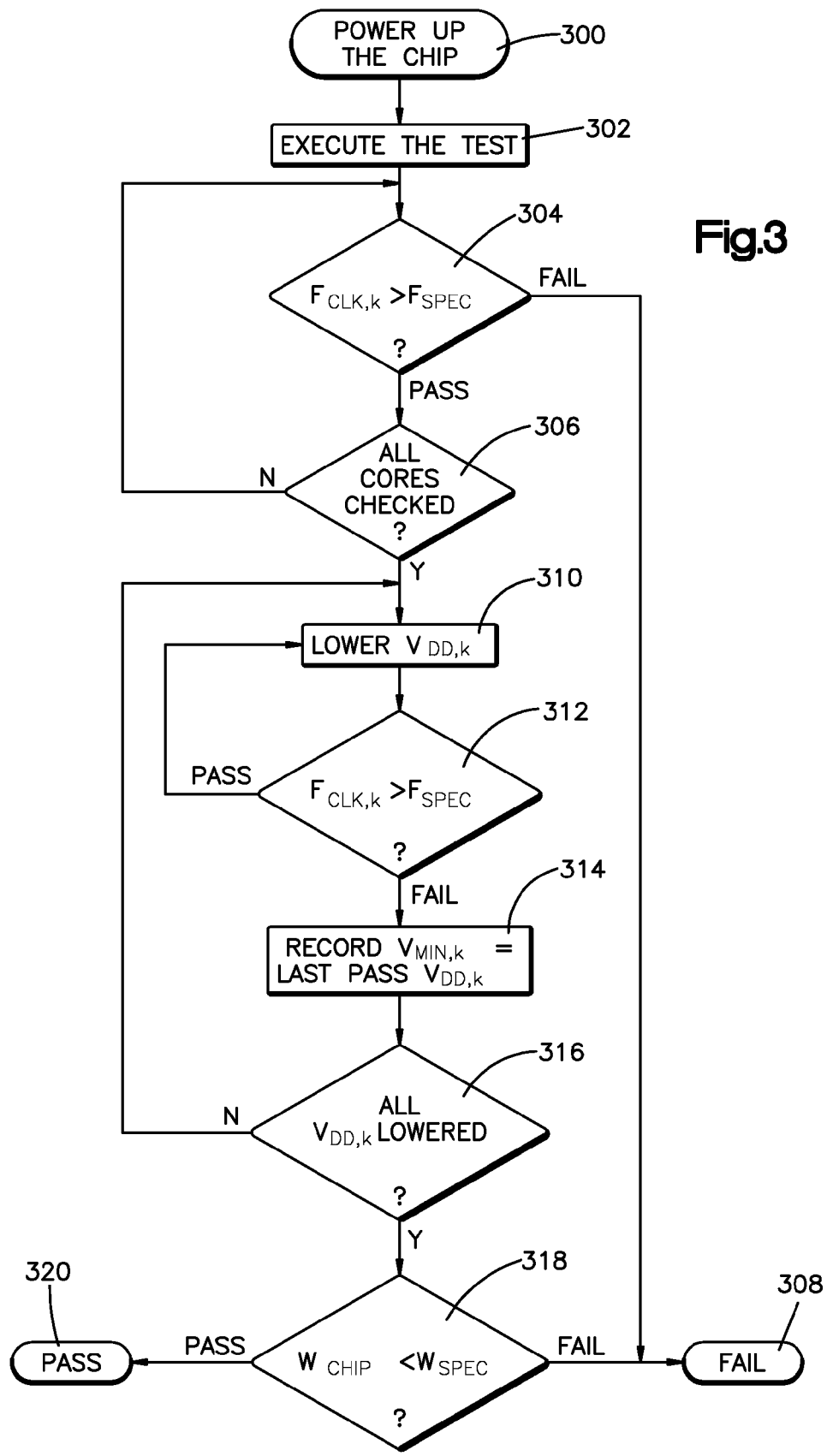
FIG. 3 illustrates a process for testing a multi-core processor structure according to the present invention.

FIG. 3 illustrates a method for testing the configurable MCP 200 according to the present invention. At 300 the MCP 200 is powered up and at 302 a nominal supply voltage $V_{DDnom}$ is provided to each of the cores 202,204,206,208. $V_{DDnom}$ is generally selected as appropriate for the MCP 200 architecture through one or more circuit design rules, although in other embodiments it may be determined through other means. At 304 and 306 the clock rates $f_{CLK, k}$ of each of the cores 202,204,206,208 are checked to ensure that they meet a minimum reference clock speed $f_{spec}$ for the specified nominal power supply voltage $V_{nom}$. In the embodiment illustrated in FIG. 3, if any of the cores 202,204,206,208 fail ($f_{CLK, k} < f_{spec}$) than the MCP 200 fails and the test process ends at 308.

Alternatively, if each core 202,204,206,208 meets the minimum reference clock speed $f_{spec}$ requirements then a first core k (202,204,206 or 208) is selected and a new lower supply voltage $V_{DD-0,k}$ is supplied to the core k at 310, thereby causing the first core k to operate at a new lower clock rate $f_{cLK-0, k}$ which is compared to the reference clock speed $f_{spec}$ at 312. If the new lowered core clock rate $f_{cLK-0, k}$ does not meet the specifications (for example, $f_{CLK, k}$ is less than or equal to the $f_{spec}$) at the new lower power supply voltage $V_{DD-0, k}$, then the previous original power supply voltage $V_{DDnom}$, k is set as $V_{Min, k}$ for the core k at 314, and the process iterates through the remaining cores (202,204,206 or 208) as shown at 316.

However, if the new lowered core clock rate $f_{cLK-0, k}$ meets specifications (for example, $f_{CLK, k} > f_{spec}$) at 312 then the new lower power supply voltage $V_{DD-0, k}$ is itself lowered to a new stepped-down value $V_{DD-1, k}$ at 310 ($V_{DD-1, k} < V_{DD-0, k}$) and the clock responsively generated by the core ($f_{CLK-1, k}$) is then compared to the minimum reference clock speed $f_{spec}$ at 312. This process continues n times until an $n^{th}$ lowered clock rate lowered core clock rate $f_{cLK-n, k}$ does not meet the specifications (for example, $f_{CLK-n, k}$ is less than or equal to the $f_{spec}$), wherein the power supply voltage $V_{DD-(n-1), k}$ for the previous passing clock rate ($f_{CLK-(n-1),k}$) is set as the adjusted minimum nominal power supply voltage $V_{Min, k}$ for the core 202 at 314 by the controller 210.

With the $V_{DD, k}$ for each core 202,204,206,208 thus set to each respective $V_{Min, k}$, the overall chip power consumption $W_{CHIP}$ is determined with each core clocking at its $V_{Min, k}$ supply voltage and $W_{CHIP}$ compared to a specified maximum power consumption value $W_{MAX}$ at 318. The chip 200 is then responsively passed at 320 or failed at 308. Thus, if any of the cores 202,204,206,208 have their supply voltage lowered ($V_{Min, k} < V_{DDnom}$) the overall chip power consumption $W_{CHIP}$ is thereby lowered, and the likelihood of the chip 200 passing the power consumption specification ($W_{CHIP} < W_{MAX}$) is improved. The present invention thereby provides advantages by configuring the chip 200 to lower overall chip power consumption prior to testing the chip against overall chip power consumption specifications, improving the probability that each chip 200 will meet specifications and thus increasing chip 200 manufacturing yields.

Figure 4:
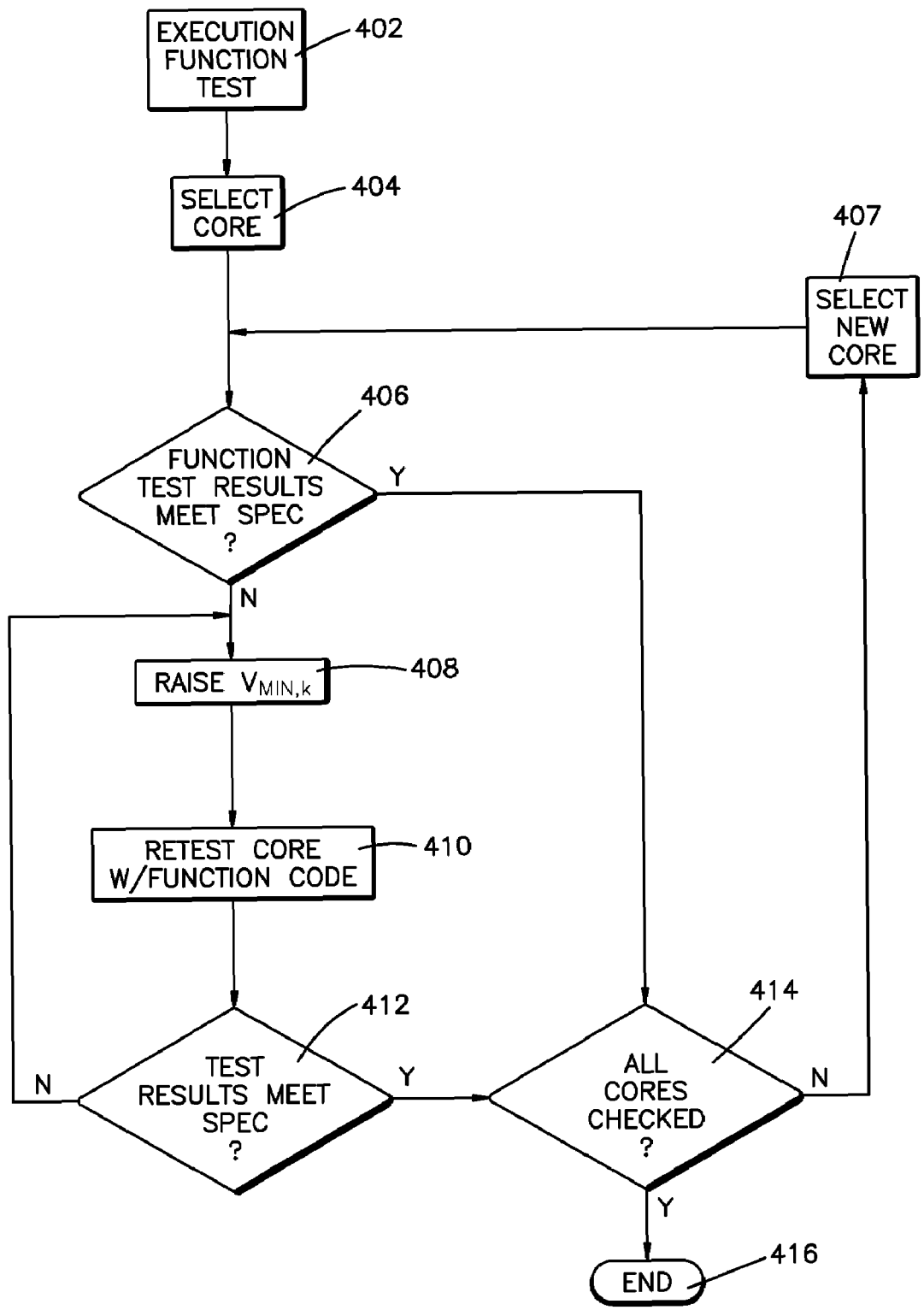
FIG. 4 illustrates another process for testing a multi-core processor structure according to the present invention.

In one example, each $V_{Min,k}$ may be increased as required in response to one or more additional test codes. For example, referring now to FIG. 4, after each core $V_{Min,k}$ is set and the MCP chip passes overall chip power consumption requirements (for example, as illustrated in FIG. 3 and described above), at 402 one or more functional test code(s) is/are executed on each core 202,204,206,208 and corresponding core performances are observed. A functional test code may be selected wherein execution of the code approximates one or more core behaviors or environments and each core thus assessed for performance at its $V_{Min,k}$: examples include core bottleneck behavior codes and design path worst-case delay codes, and other functional codes may be practiced according to the present invention, some of which will be apparent to one skilled in the art.

At 404 a first core k is selected and a function test code performance is compared to a specification requirement at 406. If test results meet specifications then the next core k is selected at 407 until all cores are tested (as shown at 414). If however the core k test results do not meet required performance characteristic(s) at $V_{Min,k}$ at 406, then at 408 $V_{Min,k}$ is raised and the core k is retested with the functional code(s) at 410. In this fashion the $V_{Min,k}$ is raised one or more times until at 412 the core k meets the required performance. At 414 this process is thus repeated for the remaining individual cores k until all cores 202,204,206,208 meet the performance requisites and the process ends at 416, thus with each $V_{Min,k}$ individually incremented as required.

Figure 5:
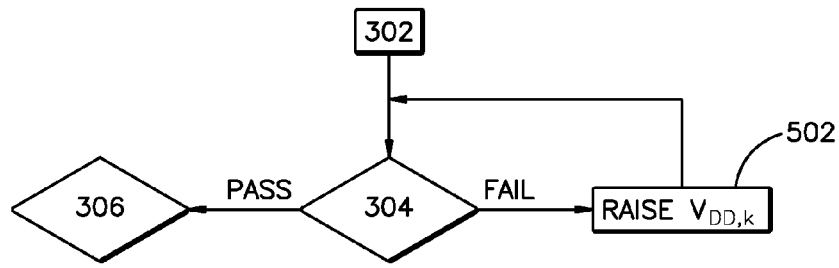
FIG. 5 illustrates another process for testing a multi-core processor structure according to the present invention.

The present invention may also raise the clock rate of cores that do not meet a minimum reference clock speed, thereby enabling an otherwise failing MCP chip 200 to pass a minimum reference clock specification, further increasing manufacturing yields. In one example illustrated in FIG. 5, the process of FIG. 3 incorporates an additional configuration process step 502 wherein each core k failing to meet the minimum reference clock speed at 304 has its supply voltage $V_{DD,k}$ raised until its clock rate $f_{CLK,k}$ meets the $f_{spec}$ requirement. Thus, according to the present invention, during testing of the chip 200 each core supply voltage $V_{DD,k}$ may be raised or lowered as needed until each core meets the appropriate specification, thus configuring the MCP 200 chip to pass both minimum and maximum core clock rate specifications during testing in the present example.

The present invention provides for repetitive lowering iterations in order to enable graduated and/or incremental voltage lowering of each supply voltage $V_{DD,k}$ (for example, at steps 310 and 312 above), which may gradually lower a core supply voltage $V_{DD,k}$ for each core 202,204,206,208 to determine the lowest supply voltage at which each individual core will evidence a clock rate required by specifications (for example, $V_{DD-(n-1),k}$). In one example, the $V_{DD,k}$ is lowered by the same fixed amount incrementally in a step-down fashion at each subsequent repeated lowering at 310. Alternative embodiments may lower the $V_{DD,k}$ in different and divergent amounts between repetitions: for example a second iteration lowering amount may be a logarithmic or algorithmic function of a previous first lowering amount. In some embodiments one or more of the supply voltages $V_{DD,k}$ may be selected through a search algorithm, for example through a binary search. Other means may also be used to determine the amount by which a power supply $V_{DD,k}$ is lowered at any iteration of step 310, and the present invention is not limited to the examples described herein.

Thus, the power supply 212,214,216 or 218 for any respective core 202,204,206 or 208 may be adjusted to raise or lower the respective power supply voltage $V_{DD,k}$ provided. Rather than providing each core the same $V_{DD}$ value and then testing the MCP chip 200 as taught in the prior art, by lowering at least one individual core's supply voltage $V_{DD,k}$ the testing routines according to the present invention achieve a corresponding lowering of chip power consumption $W_{CHIP}$, which may enable the chip 200 to meet a maximum power consumption value $W_{MAX}$ that it otherwise would have been exceeded under prior art methods. And by raising at least one individual core's supply voltage $V_{DD,k}$ to comply with a minimum clock rate $f_{spec}$, the testing routines according to the present invention enable an otherwise failing MCP chip 200 to pass another specification.

The faster a given core 202,204,206,208 is at $V_{Nom}$, the greater the amount of $V_{DD}$ reduction may be achieved in setting its $V_{Min}$, which corresponds to greater reductions in overall chip power consumption $W_{CHIP}$. Thus, faster cores 202,204,206,208 provide greater total $V_{DD}$ reductions according to the present invention, directly translating faster core performances at similar supply voltages into lower overall chip 200 power consumption $W_{CHIP}$ values on an individual basis.

In another advantage, routines that test individual cores against a maximum clock rate specifications (for example, $f_{max}$) generally required under prior art chip testing methods may be eliminated. As long as each individual core's clock rate $f_{CLK,k}$ exceeds a designated minimum clock rate $f_{spec}$ at $V_{nom}$, and total chip power consumption $W_{CHIP}$ doesn't exceed a designated maximum $W_{MAX}$, then there may be no need to set a clock rate limit $f_{max}$ ceiling. Thus, further efficiencies are obtained eliminating said test routines, as well as the possibility that the MCP chip 200 will fail such individual core maximum clock rate specification.

Figure 6:
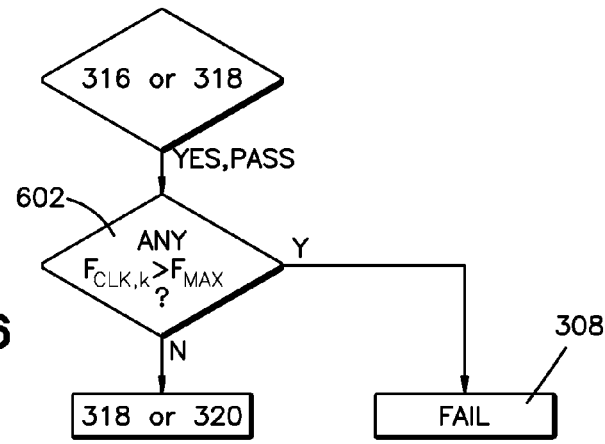
FIG. 6 illustrates another process for testing a multi-core processor structure according to the present invention.

Alternatively, if individual cores are required to meet a maximum clock rate specification, then in some embodiments testing the MCP chip 200 may encompass verifying that each core k meets said specification. Thus, in one example illustrated in FIG. 6, subsequent to determining each core's adjusted power supply voltage $V_{Min,k}$ at 316 or 318 as described above, the core clock rate $f_{CLK,k}$ at $V_{Min,k}$ is compared to a specified maximum rate $f_{max}$ at 602, wherein if any of the cores k fail to meet the maximum rate specification (for example, $f_{CLK,k} > f_{max}$), then the MCP chip fails at 308.

It will also be appreciated that in setting individual core voltage supply values $V_{Min,k}$ that one or more margin values may be used, for example to provide for margins or error or operational anomalies, as is well known in engineering conventions. Thus, in one or more embodiments of the chip 200 configuration processes discussed above (for example, at one or more of steps 310, 408 and 502), a core's supply voltage $V_{DD,k}$ is raised or lowered until the core's clock rate $f_{CLK,k}$ meets the required specification (312, 412 or 304, respectively) plus a margin value $f_{Margin}$. In this fashion MCP chip 200 functionality becomes more robust at the margin of $f_{spec}$ clock rates, though perhaps at the cost of providing lower power consumption efficiencies due to correspondingly higher $V_{Min}$ settings.

In alternative embodiments, margin voltage amounts may be provided. For example, when it is determined that a given supply voltage $V_{DD,k}$ produces a core clock rate $f_{clk,k}$ meeting a relevant specification, then a margin voltage amount $V_{Margin}$ may be added or subtracted to the determined supply voltage $V_{DD,k}$ to define $V_{Min}$ (for example, at one or more of steps 314, 412 and 304). This provides advantages in some MCP processes and architectures wherein defining and/or providing for clock rate margin values, such as the $f_{Margin}$ configuration process described above, may be non-trivial. Thus a $V_{Margin}$ may provide robust chip 200 functionality at the margins of varying operational or supply voltage environments.

The present invention may also be configured to limit an amount that $V_{DD}$ may be lowered by to determine each $V_{Min,\ k}$, for example to assure core functionality and/or desired performance characteristics. In one aspect, core 202, 204,206,208 digital circuitry may maintain functionality within an expected range of power supply voltages defined by manufacturing technology limits for the specific MCP 200 architecture. The present invention may accordingly be configured to ensure that total $V_{DD,\ k}$ reductions in establishing adjusted minimum nominal values $V_{Min,\ k}$ do not exceed allowable ranges for relevant technology limits. Thus, the present invention may limit $V_{Min,k}$ to a value or value range relative to a specific $V_{DD}$ value, for example in order to enable efficient handling of a core's input and output data, meet a required voltage swing amplitude and/or average level, or meet an error rate specifications. Other requirements may also be recognized by one skilled in the art and a $V_{Min,\ k}$ selected in response thereto, and the present examples are not exhaustive but are merely illustrative. Thus, in one example, at one or more of steps 314, 412 and 304 a minimum supply voltage threshold $V_{TH}$ is provided below which $V_{Min,k}$ may not be lowered or above which $V_{Min,k}$ may not be raised, and $V_{Min,k}$ is only decreased or increased until $V_{TH}$ is reached.

As described above, adjusted core power supply voltages may be determined by incrementally raising or lowering previous power supply values (for example, at one or more of 310, 408 or 502 above). In alternative embodiments, previous $V_{DD,\ k}$ values observed are saved at each testing iteration (for example, at one or more of 304, 314, or 412 above), and these saved values are selected and a core k retested through one or more subsequent iterations (for example, at one or more of 310, 408 or 502 above) until the lowest or highest previously saved $V_{DD,\ k}$ value passing the respective test is selected as the new $V_{Min,k}$ for the core k (for example, at one or more of 304, 314, or 412 above).

II. Computerized Implementation

Figure 7:
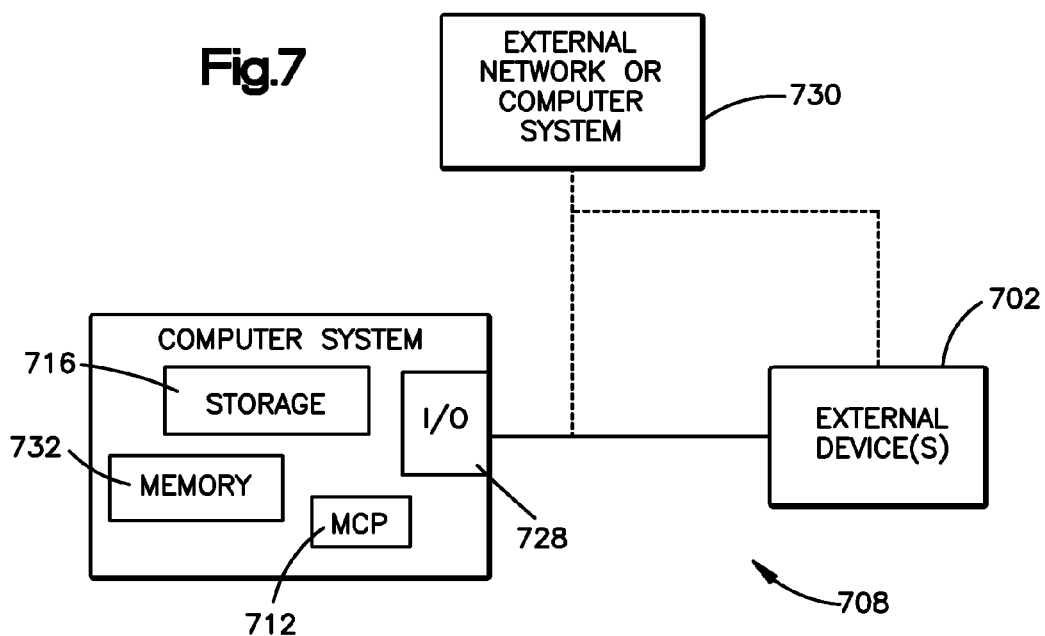
FIG. 7 is a schematic representation of a computing structure appropriate for practicing the present invention.

Referring now to FIG. 7, a diagram of a computerized implementation 708 of the present invention is shown. As depicted, implementation 708 includes an multi-core processor chip 712 deployed within a computer system 704 which demonstrates, among other things, that the present invention could be implemented within a network environment (e.g., the Internet, a wide area network (WAN), a local area network (LAN), a virtual private network (VPN), etc.), or on a stand-alone computer system. In the case of the former, communication throughout the network can occur via any combination of various types of communications links. For example, the communication links can comprise addressable connections that may utilize any combination of wired and/or wireless transmission methods. Where communications occur via the Internet, connectivity could be provided by conventional TCP/IP sockets-based protocol, and an Internet service provider could be used to establish connectivity to the Internet. Still yet, computer infrastructure 708 is intended to demonstrate that some or all of the components of implementation 708 could be deployed, managed, serviced, etc. by a service provider who offers to implement, deploy, and/or perform the functions of the present invention for others.

As shown, computer system 704 includes the MCP 712, a memory 732, a storage system 716 and an input/output (I/O) interface 728. Further, the computer system 704 is shown in communication with external device 702 computer systems and an external computer or computer network 730. In general, the MCP 712 executes computer program code, which may be stored in the memory 732 and/or the storage system 716. While executing computer program code, the MCP 712 can read and/or write data to/from memory 732, storage system 716, and/or I/O interface 728. External device 702 can comprise any device (e.g., keyboard, pointing device, display, etc.) that enables a user to interact with computer system 704 and/or any devices (e.g., network card, modem, etc.) that enable the computer system 704 to communicate with one or more other computing devices 730.

The computer infrastructure 708 is only illustrative of various types of computer infrastructures for implementing the invention. For example, in one embodiment, computer infrastructure 708 comprises two or more computing devices 704, 730 (e.g., a server cluster) that communicate over a network to perform the various process steps of the invention. Moreover, computer system 708 is only representative of various possible computer systems that can include numerous combinations of hardware. To this extent, in other embodiments, the computer system 708 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively. Moreover, memory 732 and/or storage system 716 can comprise any combination of various types of data storage and/or transmission media that reside at one or more physical locations. Further, I/O interface 728 can comprise any system for exchanging information with one or more external device 702. Still further, it is understood that one or more additional components (e.g., system software, math co-processing unit, etc.) not shown in FIG. 7 can be included in computer system 704. However, if computer system 704 comprises a handheld device or the like, it is understood that one or more external devices 702 (e.g., a display) and/or storage system 716 could be contained within computer system 704, not externally as shown in part.

Storage system 716 can be any type of system (e.g., a database) capable of providing storage for information under the present invention. To this extent, storage system 716 could include one or more storage devices, such as a magnetic disk drive or an optical disk drive. In another embodiment, storage system 716 includes data distributed across, for example, a local area network (LAN), wide area network (WAN) or a storage area network (SAN) (not shown). In addition, although not shown, additional components, such as cache memory, communication systems, system software, etc., may be incorporated into computer system 704.

Thus, the computer system memory 732, or similar structures within the external device 702 or the external computer or computer network 730 may comprise an MCP testing application, said application configured to perform one or more of the processes of the present invention as discussed above. Specifically, MCP configuration software may comprise computer executable program code, said code comprising instructions which, when executed on the computer system 704 and/or 730, causes the computer system 704,730 to test multi-core processor chip structure 712 individual processors, optionally by selectively adjusting core power supply voltages to ensure that one or more cores operate at clock rates in compliance with one or more performance specifications.

While shown and described herein as a method and system for testing multi-core processor structures, it is understood that the invention further provides various alternative embodiments. For example, in one embodiment, the invention provides a computer-readable/useable medium that includes computer program code to enable a computer infrastructure to practice the steps of the present invention as discussed above. To this extent, the computer-readable/useable medium includes program code that implements each of the various process steps of the invention. It is understood that the terms computer-readable medium or computer useable medium comprises one or more of any type of physical embodiment of the program code. In particular, the computer-readable/useable medium can comprise program code embodied on one or more portable storage articles of manufacture (e.g., a compact disc, a magnetic disk, a tape, etc.), on one or more data storage portions of a computing device, such as memory 732 and/or storage system 716 (e.g., a fixed disk, a read-only memory, a random access memory, a cache memory, etc.), and/or as a data signal (e.g., a propagated signal) traveling over a network (e.g., during a wired/wireless electronic distribution of the program code).

In another embodiment, the invention provides a business method that performs the process steps of the invention on a subscription, advertising, and/or fee basis. That is, a service provider, such as a Solution Integrator, could offer to test MCP structures for specification compliance, including optionally and selectively adjusting individual processor core power supply voltages to ensure that one or more cores operate at clock rate(s) in compliance with one or more performance specifications. In this case, the service provider can create, maintain, support, etc., a computer infrastructure, such as all or part of the computer infrastructure 708, which performs the process steps of the invention for one or more customers. In return, the service provider can receive payment from the customer(s) under a subscription and/or fee agreement and/or the service provider can receive payment from the sale of advertising content to one or more third parties.

In still another embodiment, the invention provides a computer-implemented method for testing MCP structures, including the option of selectively adjusting individual processor core power supply voltages to ensure that one or more cores operate at clock rates in compliance with one or more performance specifications. In this case, a computer infrastructure, such as computer infrastructure 708, can be provided and one or more systems for performing the process steps of the invention can be obtained (e.g., created, purchased, used, modified, etc.) and deployed to the computer infrastructure. To this extent, the deployment of a system can comprise one or more of: (1) installing program code on a computing device, such as computer system 704, from a computer-readable medium (for example, a storage unit 716); (2) adding one or more computing devices 730 to the computer infrastructure; and (3) incorporating and/or modifying one or more existing systems 704,730 of the computer infrastructure to enable the computer infrastructure to perform the process steps of the invention.

As used herein, it is understood that the terms "program code" and "computer program code" are synonymous and mean any expression, in any language, code or notation, of a set of instructions intended to cause a computing device having an information processing capability to perform a particular function either directly or after either or both of the following: (a) conversion to another language, code or notation; and/or (b) reproduction in a different material form. To this extent, program code can be embodied as one or more of: an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

We claim:

1. A method for manufacturing yield testing and configuring a multi-core processor system chip comprising a plurality of processing cores, comprising:

setting at least one adjustable power supply component to provide a supply voltage having an initial nominal supply voltage value to each of the plurality of processing cores, the initial nominal supply voltage value specified as operating a processing core at a minimum reference clock speed pursuant to a design rule;

for N iterations selecting a core of the plurality of processing cores and iteratively lowering a core set supply voltage provided by the at least one adjustable power supply component to the selected core and observing a clock speed of the selected core at the lowered supply voltage until an Nth observed clock speed generated responsive to an Nth lowered supply voltage is less than the minimum reference clock speed and setting the at least one adjustable power supply component to provide an (N−1)th lowered supply voltage as an operative supply voltage to the selected core;

repeating the N iteration core selecting, the iterative supply voltage lowering and clock speed observing and the (N−1)th lowered supply voltage operative supply voltage setting for each unselected core of the processing core plurality until each of the cores has been selected, wherein different cores may have different core operative supply voltages set relative to the minimum reference clock speed;

determining an overall power consumption value for the multi-core processor system with each of the plurality of cores operating at its respective set operative supply voltage; and passing the multi-core processor system chip if the overall power consumption value does not exceed a specified maximum power consumption value; or failing the chip.

2. The method of claim 1, wherein prior to the N iteration core selecting, the iterative supply voltage lowering and clock speed observing and (N−1)th lowered supply voltage operative supply voltage setting for each unselected core, the method further comprises:

identifying at least one core of the plurality of cores as a failing core in response to the at least one core operating below the minimum reference clock speed in response to the at least one adjustable power supply component supplying the initial nominal supply voltage;

for X iterations selecting a core of the at least one core failing core and iteratively raising the supply voltage provided by the at least one adjustable power supply component to the selected failing core and observing a clock speed of the selected failing core at the raised supply voltage until an Xth observed clock speed generated responsive to an Xth raised supply voltage is greater than or equal to the minimum reference clock speed and setting the at least one adjustable power supply component to provide the Xth raised supply voltage as the set core supply voltage to the selected core; and repeating the failing core selecting, the iterative failing core supply voltage raising and clock speed observing and the Xth raised supply voltage set core supply voltage setting for each unselected failing core of the at least one failing core until each of the at least one failing cores has been selected.

3. The method of claim 2, wherein after the passing of the multi-core processor system chip if the overall power consumption is less than a specified maximum power consumption value, the method further comprises:

selecting a functional test core of the plurality of cores and executing a functional test code thereupon at the functional test core set operating voltage supply value, and if the selected functional test core executing of the functional test code does not meet a specification requirement, for Y iterations iteratively raising the selected functional test core set operative supply voltage and observing an executing of the functional test code of the selected functional test core at the raised operative supply voltage until a Yth observed execution of the functional test code meets the specification requirement and setting the at least one adjustable power supply component to provide the Yth raised supply voltage as the set operative supply voltage to the selected core; and repeating the functional test core selecting, the functional test core iterative supply voltage raising and clock speed observing and the Yth raised supply voltage operative supply voltage setting for each remaining core of the processing core plurality until all of the plurality of cores has been selected.

4. The method of claim 3, wherein the functional test code is a core bottleneck behavior code or a design path worst-case delay code.

5. The method of claim 4, wherein at least one of lowering or raising a core supply voltage comprises:

selecting a lowest supply voltage of a plurality of ordered discrete supply voltages that is also greater than a specified functional threshold voltage; or selecting a highest supply voltage of a plurality of ordered discrete supply voltages that is also lower than a specified functional threshold voltage.

6. The method of claim 4, wherein at least one of lowering or raising a core supply voltage comprises lowering or raising a previous iteration supply voltage by a logarithmic or algorithmic function of the previous iteration supply voltage.

7. The method of claim 4, wherein at least one of lowering or raising a core supply voltage comprises selecting a lower or higher supply voltage value through a search algorithm.

8. A method for manufacturing yield testing and configuring a plurality of processing cores, the method comprising:

producing computer executable program code;

storing the code on a computer readable medium; and providing the program code to be deployed and executed on a computer system; the program code comprising instructions which, when executed on the computer system, cause the computer system to test and configure a multi-core processor system chip comprising a plurality of processing cores by:

setting at least one adjustable power supply component to provide a supply voltage having an initial nominal supply voltage value to each of the plurality of processing cores, the initial nominal supply voltage value specified to operate a processing core at a minimum reference clock speed pursuant to a design rule;

for N iterations selecting a core of the plurality of processing cores and iteratively lowering a core set supply voltage provided by the at least one adjustable power supply component to the selected core and observing a clock speed of the selected core at the lowered supply voltage until an Nth observed clock speed generated responsive to an Nth lowered supply voltage is less than the minimum reference clock speed and setting the at least one adjustable power supply component to provide an (N−1)th lowered supply voltage as an operative supply voltage to the selected core;

repeating the N iteration core selecting, the iterative supply voltage lowering and clock speed observing and the (N−1)th lowered supply voltage operative supply voltage setting for each unselected core of the processing core plurality until each of the cores has been selected, wherein different cores may have different core operative supply voltages set relative to the minimum reference clock speed;

determining an overall power consumption value for the multi-core processor system with each of the plurality of cores operating at its respective set operative supply voltage; and passing the multi-core processor system chip if the overall power consumption value does not exceed a specified maximum power consumption value; or failing the chip.

9. The method of claim 8, wherein the program code further comprises instructions which, when executed on the computer system, cause the computer system to test and configure the multi-core processor system chip, prior to the N iteration core selecting, the iterative supply voltage lowering and clock speed observing and (N−1)th lowered supply voltage operative supply voltage setting for each unselected core, by:

identifying at least one core of the plurality of cores as a failing core in response to the at least one core operating below the minimum reference clock speed in response to the at least one adjustable power supply component supplying the initial nominal supply voltage;

for X iterations selecting a core of the at least one core failing core and iteratively raising the supply voltage provided by the at least one adjustable power supply component to the selected failing core and observing a clock speed of the selected failing core at the raised supply voltage until an Xth observed clock speed generated responsive to an Xth raised supply voltage is greater than or equal to the minimum reference clock speed and setting the at least one adjustable power supply component to provide the Xth raised supply voltage as the set core supply voltage to the selected core; and repeating the failing core selecting, the iterative failing core supply voltage raising and clock speed observing and the Xth raised supply voltage set core supply voltage setting for each unselected failing core of the at least one failing core until each of the at least one failing cores has been selected.

10. The method of claim 9, wherein the program code further comprises instructions which, when executed on the computer system, cause the computer system to test and configure the multi-core processor system chip, after the passing of the multi-core processor system chip if the overall power consumption is less than a specified maximum power consumption value, by:

selecting a functional test core of the plurality of cores and executing a functional test code thereupon at the functional test core set operating voltage supply value, and if the selected functional test core executing of the functional test code does not meet a specification requirement, for Y iterations iteratively raising the selected functional test core set operative supply voltage and observing an executing of the functional test code of the selected functional test core at the raised operative supply voltage until a Yth observed execution of the functional test code meets the specification requirement and setting the at least one adjustable power supply component to provide the Yth raised supply voltage as the set operative supply voltage to the selected core; and repeating the functional test core selecting, the functional test core iterative supply voltage raising and clock speed observing and the Yth raised supply voltage operative supply voltage setting for each remaining core of the processing core plurality until all of the plurality of cores has been selected.

11. The method of claim 10, wherein the functional test code is a core bottleneck behavior code or a design path worst-case delay code.

12. The method of claim 11, wherein at least one of lowering or raising a core supply voltage comprises:

selecting a lowest supply voltage of a plurality of ordered discrete supply voltages that is also greater than a specified functional threshold voltage; or selecting a highest supply voltage of a plurality of ordered discrete supply voltages that is also lower than a specified functional threshold voltage.

13. The method of claim 11, wherein at least one of lowering or raising a core supply voltage comprises lowering or raising a previous iteration supply voltage by a logarithmic or algorithmic function of the previous iteration supply voltage.

14. The method of claim 11, wherein at least one of lowering or raising a core supply voltage comprises selecting a lower or higher supply voltage value through a search algorithm.

15. A method for deploying an application for manufacturing yield testing and configuring a plurality of processing cores, the method comprising:

providing a computer infrastructure being operable to test and configure a multi-core processor system chip comprising a plurality of processing cores by:

setting at least one adjustable power supply component to provide a supply voltage having an initial nominal supply voltage value to each of the plurality of processing cores, the initial nominal supply voltage value specified to operate a processing core at a minimum reference clock speed pursuant to a design rule;

for N iterations selecting a core of the plurality of processing cores and iteratively lowering a core set supply voltage provided by the at least one adjustable power supply component to the selected core and observing a clock speed of the selected core at the lowered supply voltage until an Nth observed clock speed generated responsive to an Nth lowered supply voltage is less than the minimum reference clock speed and setting the at least one adjustable power supply component to provide an (N−1)th lowered supply voltage as an operative supply voltage to the selected core;

repeating the N iteration core selecting, the iterative supply voltage lowering and clock speed observing and the (N−1)th lowered supply voltage operative supply voltage setting for each unselected core of the processing core plurality until each of the cores has been selected, wherein different cores may have different core operative supply voltages set relative to the minimum reference clock speed;

determining an overall power consumption value for the multi-core processor system with each of the plurality of cores operating at its respective set operative supply voltage; and passing the multi-core processor system chip if the overall power consumption value does not exceed a specified maximum power consumption value; or failing the chip.

16. The method of claim 15, wherein the computer infrastructure is further operable to test and configure the multi-core processor system chip by, prior to the N iteration core selecting, the iterative supply voltage lowering and clock speed observing and (N−1)th lowered supply voltage operative supply voltage setting for each unselected core:

identifying at least one core of the plurality of cores as a failing core in response to the at least one core operating below the minimum reference clock speed in response to the at least one adjustable power supply component supplying the initial nominal supply voltage;

for X iterations selecting a core of the at least one core failing core and iteratively raising the supply voltage provided by the at least one adjustable power supply component to the selected failing core and observing a clock speed of the selected failing core at the raised supply voltage until an Xth observed clock speed generated responsive to an Xth raised supply voltage is greater than or equal to the minimum reference clock speed and setting the at least one adjustable power supply component to provide the Xth raised supply voltage as the set core supply voltage to the selected core; and repeating the failing core selecting, the iterative failing core supply voltage raising and clock speed observing and the Xth raised supply voltage set core supply voltage setting for each unselected failing core of the at least one failing core until each of the at least one failing cores has been selected.

17. The method of claim 16, wherein the computer infrastructure is further operable to test and configure the multi-core processor system chip by, after the passing of the multi-core processor system chip if the overall power consumption is less than a specified maximum power consumption value:

selecting a functional test core of the plurality of cores and executing a functional test code thereupon at the functional test core set operating voltage supply value, and if the selected functional test core executing of the functional test code does not meet a specification requirement, for Y iterations iteratively raising the selected functional test core set operative supply voltage and observing an executing of the functional test code of the selected functional test core at the raised operative supply voltage until a Yth observed execution of the functional test code meets the specification requirement and setting the at least one adjustable power supply component to provide the Yth raised supply voltage as the set operative supply voltage to the selected core; and repeating the functional test core selecting, the functional test core iterative supply voltage raising and clock speed observing and the Yth raised supply voltage operative supply voltage setting for each remaining core of the processing core plurality until all of the plurality of cores has been selected.

18. The method of claim 17, wherein the functional test code is a core bottleneck behavior code or a design path worst-case delay code.

19. The method of claim 18, wherein the computer infrastructure is further operable to perform at least one of lowering or raising a core supply voltage by:

selecting a lowest supply voltage of a plurality of ordered discrete supply voltages that is also greater than a specified functional threshold voltage; or selecting a highest supply voltage of a plurality of ordered discrete supply voltages that is also lower than a specified functional threshold voltage.

20. The method of claim 18, wherein the computer infrastructure is further operable to perform at least one of lowering or raising a core supply voltage by lowering or raising a previous iteration supply voltage by a logarithmic or algorithmic function of the previous iteration supply voltage.

21. The method of claim 18, wherein the computer infrastructure is further operable to perform at least one of lowering or raising a core supply voltage by selecting a lower or higher supply voltage value through a search algorithm.

* * * * *